United States Patent
Ono (10) Patent No.: US 8,847,379 B2
(45) Date of Patent: Sep. 30, 2014

(54) PACKAGE MANUFACTURING METHOD AND SEMICONDUCTOR DEVICE

(71) Applicant: Canon Kabushiki Kaisha, Tokyo (JP)

(72) Inventor: Koji Ono, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 13/799,803

(22) Filed: Mar. 13, 2013

(65) Prior Publication Data

US 2013/0200505 A1    Aug. 8, 2013

Related U.S. Application Data

(62) Division of application No. 12/793,751, filed on Jun. 4, 2010, now Pat. No. 8,450,153.

(30) Foreign Application Priority Data

Jun. 30, 2009 (JP) .................. 2009-156325

(51) Int. Cl.
*H01L 23/52* (2006.01)
*H01L 23/055* (2006.01)
*H01L 23/00* (2006.01)
*H01L 23/495* (2006.01)
*H01L 23/498* (2006.01)
*H01L 27/146* (2006.01)

(52) U.S. Cl.
CPC . *H01L 23/49541* (2013.01); *H01L 2924/01028* (2013.01); *H01L 2924/01004* (2013.01); *H01L 2924/014* (2013.01); *H01L 2924/01019* (2013.01); *H01L 2224/49* (2013.01); *H01L 2924/01024* (2013.01); *H01L 2224/48091* (2013.01); *H01L 2924/01005* (2013.01); *H01L 23/055* (2013.01); *H01L 2224/73265* (2013.01); *H01L 2924/01006* (2013.01); *H01L 24/49* (2013.01); *H01L 2924/01327* (2013.01); *H01L 27/14683* (2013.01); *H01L 2924/01033* (2013.01); *H01L 2924/01082* (2013.01); *H01L 2924/16195* (2013.01); *H01L 23/49861* (2013.01); *H01L 2924/01029* (2013.01); *H01L 27/14618* (2013.01); *H01L 24/48* (2013.01)
USPC ............ 257/692; 257/E23.031; 257/E21.502; 257/E21.499; 438/123; 438/124; 438/106; 438/112

(58) Field of Classification Search
USPC ........... 257/E21.502, E21.499, E23.031, 692; 438/106, 123–127, 112
See application file for complete search history.

(56) References Cited

U.S. PATENT DOCUMENTS

| | | | |
|---|---|---|---|
| 6,686,667 B2 * | 2/2004 | Chen et al. | 257/787 |
| 6,720,207 B2 | 4/2004 | Minamio et al. | 438/123 |
| 6,984,880 B2 | 1/2006 | Minamio et al. | 257/676 |
| 2008/0258278 A1 | 10/2008 | Ramos et al. | 257/676 |
| 2009/0096041 A1 * | 4/2009 | Sakakibara et al. | 257/419 |

FOREIGN PATENT DOCUMENTS

| | | |
|---|---|---|
| CN | 1369911 | 9/2002 |
| JP | 2001-024083 | 1/2001 |
| JP | 2002-246532 | 8/2002 |

OTHER PUBLICATIONS

Office Action issued Nov. 9, 2011 by Chinese Patent Office (P.R. China) in counterpart application 201010215173.7, with translation.

* cited by examiner

*Primary Examiner* — S. V. Clark
*Assistant Examiner* — Krista Soderholm
(74) *Attorney, Agent, or Firm* — Fitzpatrick, Cella, Harper & Scinto (57) ABSTRACT

A method for manufacturing a package comprises a first step of forming a metal pattern including a frame and a plurality of leads extending inward from the frame, a second step of molding a resin pattern including a first resin portion which holds the plurality of leads from an inner side thereof, and second resin portions which cover bottom surfaces of peripheral portions, adjacent to portions to be removed, in the plurality of leads while exposing bottom surfaces of the portions to be removed in the plurality of leads, so as to hold the plurality of leads from a lower side thereof, and a third step of cutting the plurality of leads into a plurality of first leads and a plurality of second leads by removing the portions to be removed in the plurality of leads while the resin pattern keeps holding the peripheral portions in the plurality of leads.

13 Claims, 5 Drawing Sheets

PACKAGE MANUFACTURING METHOD AND SEMICONDUCTOR DEVICE

RELATED APPLICATIONS

This application is a division of A.N. Ser. No. 12/793,751, filed Jun. 4, 2010, claims benefit of that application under 35 U.S.C. §120, and claims benefit under 35 U.S.C. §119 of Japanese Patent Application No. 2009-156325, filed Jun. 30, 2009. The entire contents of each of the mentioned prior applications are incorporated herein by reference.

BACKGROUND OF THE INVENTION

1. Field of the Invention

The present invention relates to a package manufacturing method and semiconductor device.

2. Description of the Related Art

In recent image sensors such as a CCD image sensor and CMOS image sensor, digitization of output electrical signals increases the number of output electrical signals. This boosts the need to increase the number of output terminals of the package. Further, image sensors and products containing the packages of the image sensors are shrinking in size. The package needs to increase the packaging density that is the number of output terminals per unit packaging area of the package. However, decreasing the pitch between output terminals of the package has a limit, so the packaging density needs to be increased without decreasing the pitch. As a package that satisfies these demands, there is proposed a land grid array (LGA) package in which land electrodes are two-dimensionally arrayed on the bottom surface of the package.

Japanese Patent Laid-Open No. 2002-246532 discloses a method of manufacturing a land grid array (LGA) semiconductor device in which a semiconductor device is held on a surface opposite to the bottom surface of a wiring board having a plurality of land electrodes on the bottom surface, and is electrically connected to the electrodes. More specifically, as shown in FIG. 3(a) of Japanese Patent Laid-Open No. 2002-246532, a metal plate is stamped or etched, integrally molding a lead frame 10 having a die pad 13, inside inner leads 14A, and outside inner leads 14B. Recesses 14b, and projections 14a serving as lands are formed on the bottom surface of the lead frame 10. As shown in FIG. 3(b) of Japanese Patent Laid-Open No. 2002-246532, an adhesive tape 20 is adhered to the bottom surfaces of the die pad 13, inside inner lead 14A, and outside inner lead 14B. Then, as shown in FIG. 3(c) of Japanese Patent Laid-Open No. 2002-246532, a cutting punch 21 is used to punch the region between the die pad 13 and the inside inner lead 14A or that between the inside inner lead 14A and the outside inner lead 14B. As a result, the die pad 13 and the inside inner lead 14A are isolated as shown in FIG. 3(d) of Japanese Patent Laid-Open No. 2002-246532. A semiconductor device is fixed to the die pad 13, the external terminals of the semiconductor device are connected to the inside inner leads 14A and outside inner leads 14B, and the adhesive tape 20 are removed. After that, as shown in FIG. 5(b) of Japanese Patent Laid-Open No. 2002-246532, the semiconductor device and lead frame 10 are sealed with a resin. According to Japanese Patent Laid-Open No. 2002-246532, a compact lead frame having a land grid array can be easily formed from a single-layered metal plate.

Japanese Patent Laid-Open No. 2001-24083 discloses a method of manufacturing a resin-sealed semiconductor device in which a plurality of land electrodes electrically connected to a semiconductor device are arrayed on the bottom surface. More specifically, as shown in FIG. 4 of Japanese Patent Laid-Open No. 2001-24083, a punching member 17 punches a metal plate 13 so as to cut it halfway, thereby forming a terminal land frame including land structures 12 as shown in FIG. 2 of Japanese Patent Laid-Open No. 2001-24083. As shown in FIG. 9(b) of Japanese Patent Laid-Open No. 2001-24083, a semiconductor device 30 is bonded to a surface of the terminal land frame on which land structures 28 project. As shown in FIG. 9(c) of Japanese Patent Laid-Open No. 2001-24083, the semiconductor device 30 is wire-bonded to a land structure 28c and the like. As shown in FIG. 9(d) of Japanese Patent Laid-Open No. 2001-24083, the terminal land frame and semiconductor device 30 are sealed with a sealing resin 32. Then, as shown in FIG. 9(e) of Japanese Patent Laid-Open No. 2001-24083, the bottom surfaces of the land structures 28 are pushed up by a push pin from below them, thereby applying a press force. Accordingly, the land structures 28 are separated from a frame main body 26, as shown in FIG. 9(f) of Japanese Patent Laid-Open No. 2001-24083. In Japanese Patent Laid-Open No. 2001-24083, the land structures 28 are buried in the sealing resin 32 and formed inside it without peeling off. A resin-sealed semiconductor device having land electrodes can therefore be implemented.

In the manufacturing method described in Japanese Patent Laid-Open No. 2001-24083, the land structures 28 are separated from the frame main body 26 by directly applying a press force to prospective land electrode surfaces (bottom surfaces of the land structures 28).

The manufacturing method described in Japanese Patent Laid-Open No. 2002-246532 does not mention how to hold the isolated inside inner leads 14A when sealing the semiconductor device and lead frame 10 with a resin. If the isolated inside inner leads 14A are not held when sealing the semiconductor device and lead frame 10 with a resin, they may be misaligned. The misaligned inside inner leads 14A may be short-circuited to the die pad 13 or outside inner leads 14B, decreasing the efficiency percentage, that is, yield in the package manufacturing process.

SUMMARY OF THE INVENTION

The present invention provides a technique advantageous for increasing the yield in the package manufacturing process.

One of the aspects of the present invention provides a method for manufacturing a package, comprising a first step of forming a metal pattern including a frame and a plurality of leads extending inward from the frame, a second step of molding a resin pattern including a first resin portion which holds the plurality of leads from an inner side thereof, and second resin portions which cover bottom surfaces of peripheral portions, adjacent to portions to be removed, in the plurality of leads while exposing bottom surfaces of the portions to be removed in the plurality of leads, so as to hold the plurality of leads from a lower side thereof, and a third step of cutting the plurality of leads into a plurality of first leads and a plurality of second leads by removing the portions to be removed in the plurality of leads while the resin pattern keeps holding the peripheral portions in the plurality of leads.

Further features of the present invention will become apparent from the following description of exemplary embodiments (with reference to the attached drawings).

DESCRIPTION OF THE EMBODIMENTS

A method of manufacturing a package PK according to the first embodiment of the present invention will be described in order of step with reference to FIGS. 1A to 1L. FIGS. 1A to 1L are sectional views and plan views showing a package manufacturing method according to the first embodiment of the present invention. The sectional views of FIGS. 1A to 1F show sections taken along chain lines in the plan views of FIGS. 1G to 1L. A package according to the first embodiment is one in which a semiconductor chip is mounted. The semiconductor chip to be mounted contains an image sensor such as a CCD image sensor or CMOS image sensor.

Figure 1A:
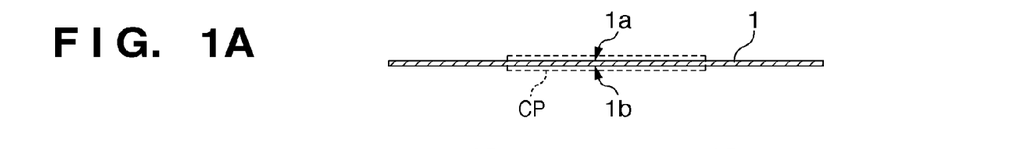
FIGS. 1A to 1L are sectional views and plan views showing a package manufacturing method according to the first embodiment.
Figure 1B:
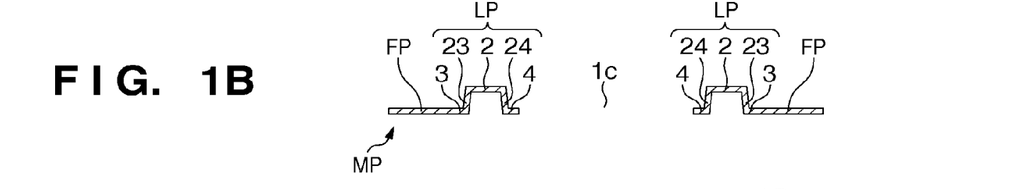
Figure 1C:
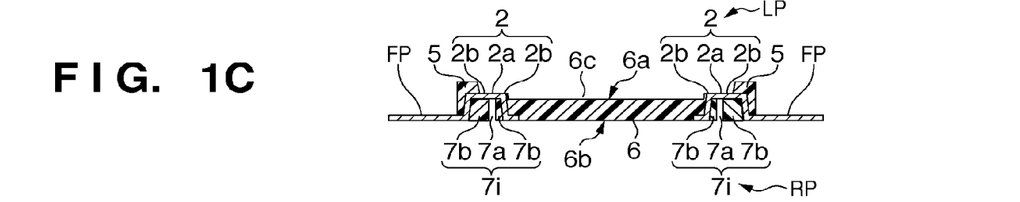
Figure 1D:
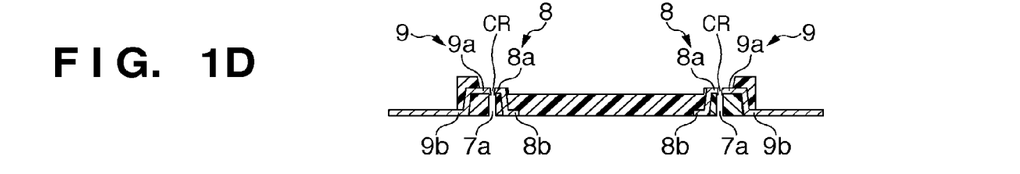
Figure 1E:
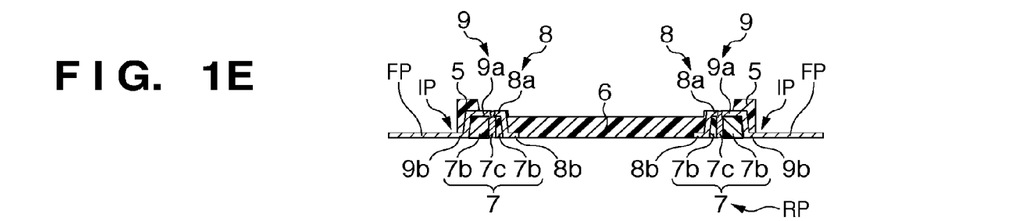
Figure 1F:
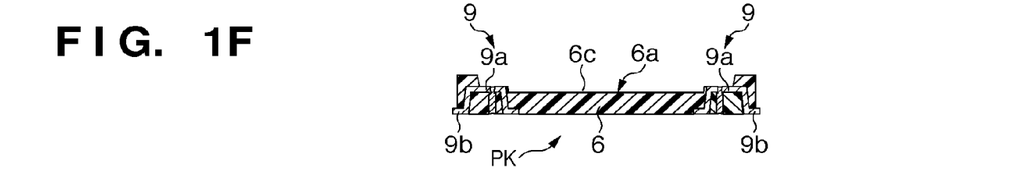
Figure 1G:
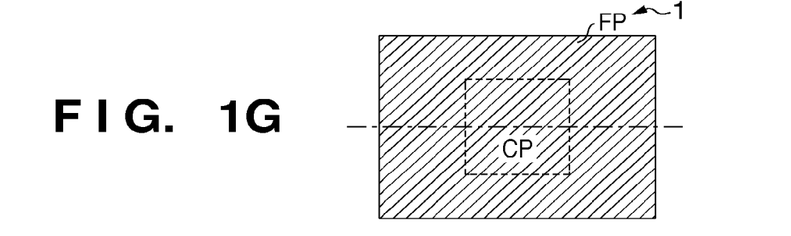

In the step of FIGS. 1A and 1G, a metal plate 1 is prepared. The metal plate 1 has a top surface 1a and bottom surface 1b. The metal plate 1 includes the prospective regions of a central portion CP and frame FP. The frame FP is positioned around the central portion CP. The metal plate 1 is formed from a material suitably used for a lead frame, for example, a metal or intermetallic compound mainly containing copper, iron, nickel, or the like.

Figure 1H:
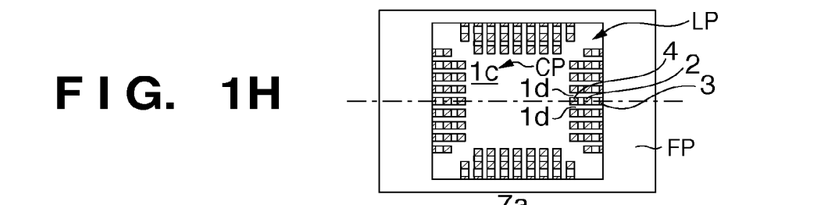

In the step (first step) of FIGS. 1B and 1H, the metal plate 1 is punched, forming a metal pattern MP. The metal pattern MP includes an opening 1c, the frame FP, and a plurality of leads LP. The opening 1c is arranged at the center. The frame FP is formed outside the opening 1c. The frame FP holds a plurality of leads LP. The leads LP are arranged between the frame FP and the opening 1c at gaps 1d between the leads LP. The gaps 1d extend from the opening 1c to the frame FP. For example, when the contour of the opening 1c and the frame FP are almost rectangular, the gaps 1d extend from the opening 1c to the frame FP in a direction perpendicular to each side of the rectangle.

When cutting the metal plate 1 without leaving the frame FP outside the opening 1c and leads LP, unlike the embodiment, the metal plate 1 is cut without holding the leads LP, and the leads LP may be misaligned after cutting.

To the contrary, in the embodiment, the metal plate 1 is cut to leave the frame FP outside the opening 1c and leads LP. In this case, the metal plate 1 is cut while holding the leads LP. Even after cutting, the leads LP are held by the frame FP and are hardly misaligned.

The leads LP are bent so that each lead LP has a first region 3, second region 4, third region 2, and inclined portions 23 and 24. The first region 3 is a portion in the lead LP and is arranged on the side of the frame FP. The second region 4 is a portion in the lead LP and is arranged on the side of the opening 1c, that is, inside the first region 3. The third region 2 is at a level higher than the first region 3 and second region 4 and is sandwiched between the first region 3 and the second region 4. The third region 2 is connected to the first region 3 and second region 4 via the inclined portions 23 and 24, respectively. The third region 2 includes a portion 2a to be removed by cutting in the step of FIGS. 1D and 1J (to be described later), and peripheral portions 2b adjacent to the portion 2a to be removed. The inclined portion 23 is inclined to connect the third region 2 and first region 3. The inclined portion 24 is inclined to connect the third region 2 and second region 4. Bending and cutting are executed using, for example, stamping.

Figures 1I, 1J:
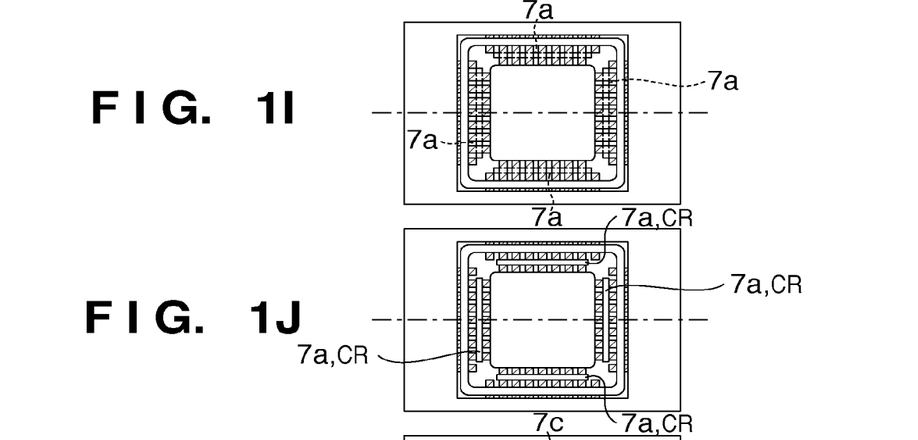

In the step (second step) of FIGS. 1C and 1I, a resin pattern RP is molded. More specifically, the resin pattern RP including a first resin portion 6, second resin portions 7i, and resin member 5 is molded with a resin. The resin is, for example, a thermoset plastic.

The first resin portion 6 fills the opening 1c so as to hold the plurality of leads LP from the inner side of the leads LP. More specifically, the first resin portion 6 is formed to cover the inclined portion between the second region 4 and the third region 2 in each lead LP from the inside and fill the opening 1c. The first resin portion 6 has a recess 6c on a top surface 6a to mount a semiconductor chip including an image sensor or the like. A bottom surface 6b is formed to be flush with the bottom surfaces of the first region 3 and second region 4 in the lead LP.

The second resin portions 7i cover the bottom surfaces of the peripheral portions, adjacent to the portions to be removed, in the leads LP while exposing the bottom surfaces of the portions to be removed in the leads LP so that the second resin portions 7i hold a plurality of leads LP from the lower side of the leads LP. More specifically, the second resin portions 7i include a plurality of trenches 7a and a plurality of main bodies 7b. The trenches 7a extend to cross the leads LP adjacent in line. Each trench 7a exposes the bottom surface of the portion 2a to be removed by cutting in the step of FIGS. 1D and 1J (to be described later) in the third region 2 of each lead LP. The main bodies 7b cover the bottom surfaces of the peripheral portions 2b adjacent to the portion 2a to be removed in the third region 2 of each lead LP. The main bodies 7b extend on the two sides of the trench 7a when viewed from the bottom. The main bodies 7b extend to be connected to the first resin portion 6 at least at the corner. In other words, the second resin portions 7i and first resin portion 6 are integrally molded. The second resin portions 7i and first resin portion 6 can hold a plurality of leads LP in cooperation with each other.

The resin member 5 is formed to cover, from the top, an edge of the third region 2 on the side of the frame FP and an edge of the first region 3 on the side of the opening 1c. The resin member 5 is formed to have a top surface at a level higher than that in the third region 2.

If no frame FP is arranged outside the leads LP in the metal pattern MP, unlike the embodiment, the resin pattern RP is molded without holding the leads LP. When molding the resin pattern RP, the leads LP may be misaligned. If the leads LP are misaligned from each other, at least some of them may be short-circuited, resulting in a defective package.

To prevent this, the frame FP is arranged outside the leads LP in the metal pattern MP in the embodiment. The resin pattern RP is molded while the frame FP holds the leads LP. The leads LP are hardly misaligned when molding the resin pattern RP. This can increase the efficiency percentage, that is, yield of the package.

In the step (third step) of FIGS. 1D and 1J, the portion 2a to be removed in each lead LP is removed while the resin pattern RP keeps holding the peripheral portions 2b in the lead LP. Hence, the leads LP are cut into a plurality of first leads 8 and a plurality of second leads 9. More specifically, the portion 2a to be removed in the third region 2 is punched from the top, removing the portion 2a from the lead LP. Accordingly, a slit including a removed region CR and the trench 7a is formed, and each lead LP is cut into the first lead 8 and second lead 9. The first lead 8 has a first portion 8a to be bonded and a first land 8b. A bonding wire is to be bonded to the first portion 8a. The first land 8b serves as a land electrode in the package. The second lead 9 has a second portion 9a to be bonded and a second land 9b. A bonding wire is to be bonded to the second portion 9a. The second land 9b serves as a land electrode in the package.

If the leads LP are cut without holding them by the resin pattern RP, unlike the embodiment, a plurality of first leads 8 and a plurality of second leads 9 may be misaligned during and after cutting.

In the embodiment, however, the leads LP are cut into a plurality of first leads 8 and a plurality of second leads 9 while the resin pattern RP keeps holding the leads LP. More specifically, cutting starts while holding the leads LP, and is completed while holding the first leads 8 and second leads 9. As a consequence, the first leads 8 and second leads 9 are hardly misaligned during and after cutting.

If the portion 2a to be removed on the bottom surface of the third region 2 of the lead LP is not exposed through the trench 7a, unlike the embodiment, the third region 2 of the lead LP needs to be cut together with the second resin portion 7i. A resin used for the package is often hard, so the resin pattern RP may be damaged, for example, chipped or cracked upon cutting the resin together with the lead. The lead LP cannot be cut finely along the designed pattern, and the package may become defective.

To prevent this, the portion 2a to be removed on the bottom surface of the third region 2 is exposed through the trench 7a in the embodiment. This reduces the possibility that the resin is cut together when punching, from the top, the portion 2a to be removed on the bottom surface of the third region 2. In punching, the lead LP can be cut finely along the designed pattern without damaging the resin pattern RP. The efficiency percentage, that is, yield of the package can therefore rise.

Assume that each lead LP does not have portions different in level and extends evenly to be flush with the bottom surface 6b of the first resin portion 6, unlike the embodiment. In this case, when the package is set on the workbench with the bottom surface 6b of the first resin portion 6 facing down and the portion 2a to be removed in the third region 2 is punched from the top, a large force is required to cut the lead LP against the drag force of the mounting surface of the workbench. That is, the lead LP cannot be cut easily.

In contrast, in the embodiment, each lead LP has the third region 2 at a level higher than the first region 3 and second region 4. When the package is set on the workbench with the bottom surface 6b of the first resin portion 6 facing down and the third region 2 is punched from the top, the lead LP can be cut regardless of the drag force of the mounting surface of the workbench. That is, the lead LP can be cut easily.

In the step of FIGS. 1D and 1J, the leads LP can be cut into a plurality of first leads 8 and a plurality of second leads 9 by using a blade, laser, or the like, instead of punching.

Figure 1K:
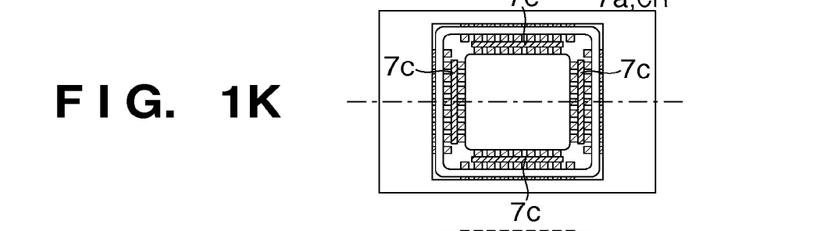

In the step of FIGS. 1E and 1K, the slits each including the removed region CR and trench 7a are filled with a resin, forming filling portions 7c. As a result, formation of second resin portions 7 including the filling portions 7c and main bodies 7b is completed. More specifically, the filling portions 7c are formed to insulate the first portions 8a to be bonded and the second portions 9a to be bonded. The main bodies 7b keep covering, from the bottom, the first portions 8a to be bonded and the second portions 9a to be bonded.

Figure 1L:
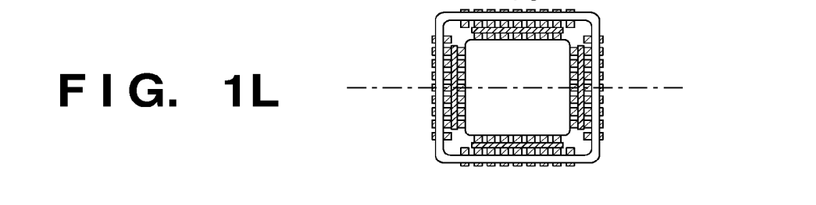

In the step (fifth step) of FIGS. 1F and 1L, regions IP (see FIG. 1E) between a plurality of second leads 9 and the frame FP are removed by cutting, thereby removing the frame FP and completing formation of the package PK. At this time, the resin pattern RP holds the first leads 8 and second leads 9. More specifically, the first resin portion 6 and second resin portions 7 hold the first leads 8. The second resin portions 7 and resin member 5 hold the second leads 9. The second resin portions 7 hold the gaps between the first leads 8 and the second leads 9. The first resin portion 6 and second resin portions 7 are integrally molded and hold the first leads 8 and second leads 9 in cooperation with each other. This structure suppresses misalignment of the leads LP when removing the frame FP.

Figure 2A:
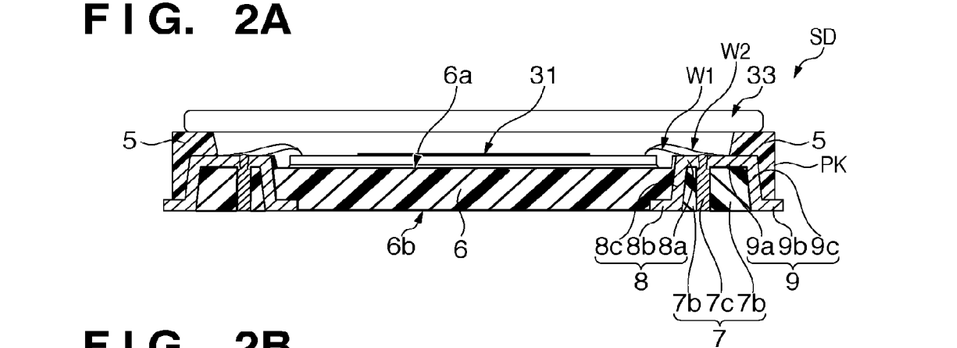
FIGS. 2A to 2C are sectional views and a plan view showing a package mounting method according to the first embodiment.
Figure 2B:
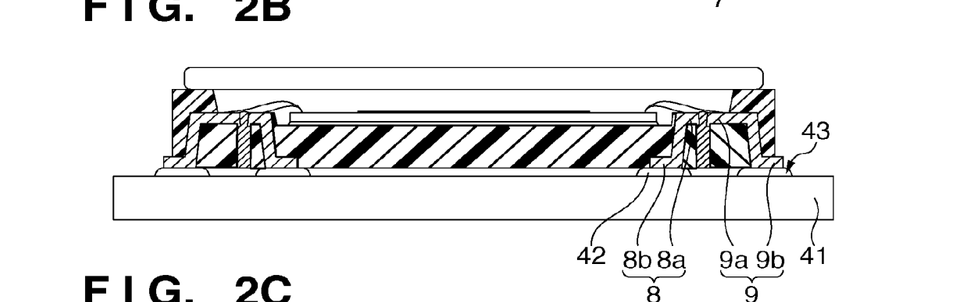
Figure 2C:
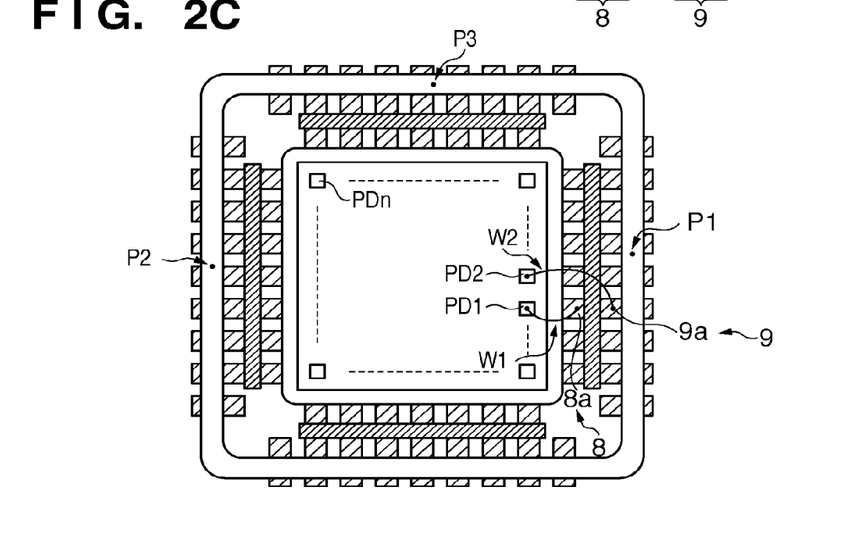

A method of mounting the package PK will be explained with reference to FIGS. 2A to 2C. FIGS. 2A and 2B are sectional views showing respective steps. FIG. 2C is a plan view showing the step in FIG. 2A.

In the step (sixth step) of FIG. 2A, a semiconductor chip 31 is mounted on the top surface of the first resin portion 6 in the resin pattern RP. More specifically, the semiconductor chip 31 is fixed via an adhesive applied to the recess 6c in the resin pattern RP. The semiconductor chip 31 contains an image sensor such as a CCD image sensor or CMOS image sensor. The semiconductor chip 31 has a plurality of pads PD1 to PDn. The pads PD1 to PDn are connected to the first leads 8 and second leads 9 via bonding wires. For example, as shown in FIG. 2C, bonding wires W1 and W2 are bonded to the pads PD1 and PD2, and the first portion 8a to be bonded and the second portion 9a to be bonded, respectively. In other words, the first portions 8a to be bonded and the second portions 9a to be bonded are connected to the different pads PD1 to PDn via bonding wires. The pads and leads may be connected by double bonding to increase reliability. Thereafter, a transparent cover 33 is fixed to the resin member 5. More specifically, the transparent cover 33 is fixed to the entire top surface of the resin member 5 to cover the entire surface of the semiconductor chip 31 and seal the inside. The resin member 5 and transparent cover 33 are fixed by, for example, pressing the transparent cover 33 against an adhesive applied to the top surface of the resin member 5, or bringing the transparent cover 33 into contact with the resin member and then applying an adhesive around the transparent cover 33. Consequently, a semiconductor device SD including the semiconductor chip 31, package PK, and transparent cover 33 is formed.

In the step of FIG. 2B, the semiconductor device SD is mounted on a circuit board 41. More specifically, electrodes are formed in advance at positions where the first lands 8b and second lands 9b of the semiconductor device SD are to be arranged on the circuit board 41. Solders 42 and 43 heated to liquefy are applied to the electrodes, and the first lands 8b and second lands 9b are arranged on the solders 42 and 43. The electrodes of the circuit board 41 are connected to the first lands 8b and second lands 9b via the solders 42 and 43. The circuit board 41 includes a flexible circuit board serving as a signal transfer means between the image sensor contained in the semiconductor chip 31, an image processing circuit (not shown), and the like, and an image processing circuit for processing a signal from the image sensor.

The structure of the semiconductor device SD according to the first embodiment of the present invention will be explained with reference to FIG. 2A. The semiconductor device SD includes the semiconductor chip 31, package PK, and transparent cover 33. The semiconductor chip 31 is mounted on the top surface of the package PK. The semiconductor chip 31 contains the image sensor. The transparent cover 33 is arranged on the top surface of the package PK. The transparent cover 33 protects the semiconductor chip 31 while transmitting light traveling toward the image sensor in the semiconductor chip 31.

The package PK includes the first resin portion 6, first leads 8, second leads 9, second resin portions 7, and resin member 5.

The first resin portion 6 has the top surface 6a and bottom surface 6b. The semiconductor chip 31 is mounted on the top surface 6a of the first resin portion 6. The first resin portion 6 holds a plurality of first leads 8.

The first leads 8 are arranged adjacently outside the first resin portion 6. Each first lead 8 has the first land 8b, the first portion 8a to be bonded, and an inclined portion 8c. The first land 8b is arranged on the side of the first resin portion 6 and extends to be flush with the bottom surface 6b of the first resin portion 6. The first land 8b is usable as a land electrode arranged on the bottom surface of the package PK. The first portion 8a to be bonded is arranged outside the first land 8b and extends to be flush with the top surface 6a of the first resin portion 6. When the bottom surface 6b of the first resin portion 6 serves as a reference, the first portion 8a to be bonded can be almost flush with a pad to be connected via a bonding wire on the semiconductor chip 31. That is, the first leads 8 have a structure suitable for easily connecting the first portions 8a to be bonded and pads via bonding wires.

The second leads 9 are arranged outside the first leads 8. Each second lead 9 has the second portion 9a to be bonded, the second land 9b, and an inclined portion 9c. The second portion 9a to be bonded is arranged on the side of the first resin portion 6 and extends to be flush with the top surface 6a of the first resin portion 6. When the bottom surface 6b of the first resin portion 6 serves as a reference, the second portion 9a to be bonded can be almost flush with a pad to be connected via a bonding wire on the semiconductor chip 31. That is, the second leads 9 have a structure suited to easily connect the second portions 9a to be bonded and pads via bonding wires. The second land 9b is arranged outside the second portion 9a to be bonded, and extends to be flush with the bottom surface 6b of the first resin portion 6. The second land 9b is usable as a land electrode arranged on the bottom surface (lower surface) of the package PK.

Each second resin portion 7 includes the filling portion 7c which fills the slit, and the main body 7b. The filling portions 7c insulate the first portions 8a to be bonded and the second portions 9a to be bonded from each other. The main bodies 7b cover the first portions 8a to be bonded and the second portions 9a to be bonded from below them.

The resin member 5 covers, from the top, an edge of the third region 2 on the side of the frame FP and an edge of the first region 3 on the side of the opening 1c. The resin member 5 extends from the third region 2 and first region 3 in a direction in which it is spaced apart upward. The resin member 5 has a top surface at a level higher than that in the third region 2.

As described above, the first embodiment can provide a semiconductor device suitable for easily connecting portions to be bonded and pads via bonding wires. A plurality of first lands and a plurality of second lands are arranged two-dimensionally on the bottom surface (lower surface) of the package. That is, land electrodes are arranged in a rectangular shape on two lines. This arrangement can easily increase the packaging density.

A method of manufacturing a package PKj according to the second embodiment of the present invention will be described with reference to FIGS. 3A to 3L. FIGS. 3A to 3L are sectional views and plan views showing a package manufacturing method according to the second embodiment of the present invention. The sectional views of FIGS. 3A to 3F show sections taken along chain lines in the plan views of FIGS. 3G to 3L. A difference from the first embodiment will be mainly explained.

Figure 3A:
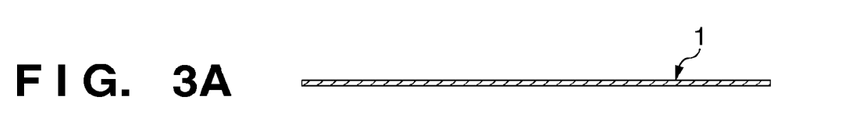
FIGS. 3A to 3L are sectional views and plan views showing a package manufacturing method according to the second embodiment.
Figure 3B:
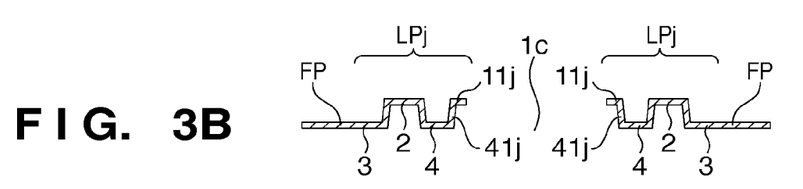
Figure 3C:
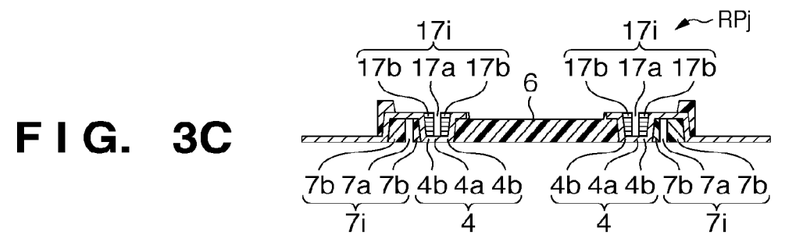
Figure 3D:
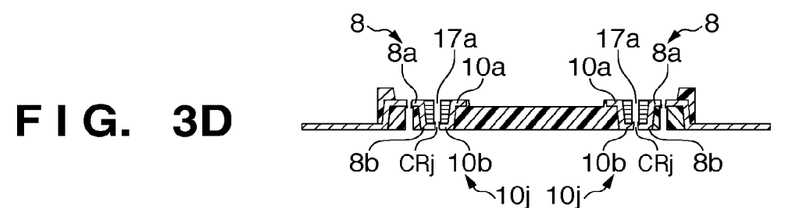
Figure 3E:
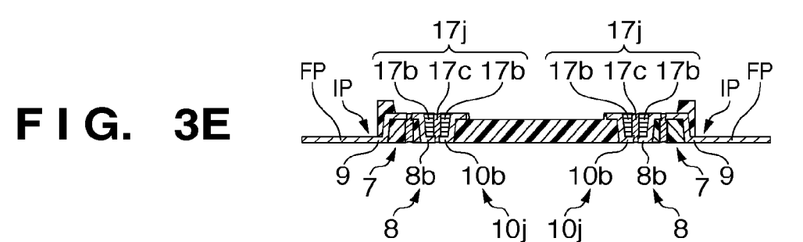
Figure 3F:
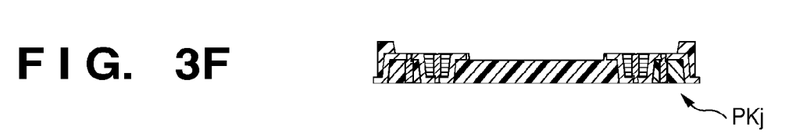
Figure 3G:
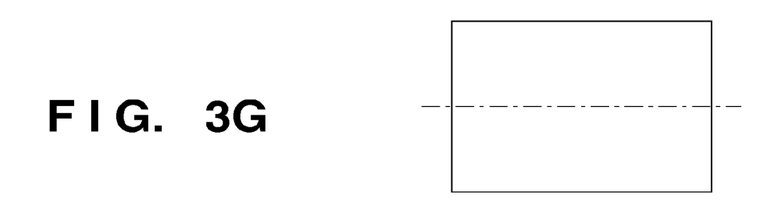
Figure 3H:
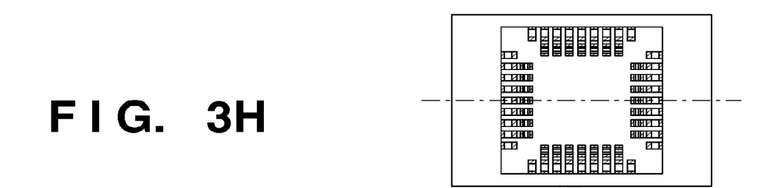

In the step of FIGS. 3B and 3H, a metal plate 1 is punched, similar to the step of FIGS. 1B and 1H. A plurality of leads LPj are bent so that each lead LPj further has a fourth region 11j and inclined portion 41j. The fourth region 11j is at a level higher than a first region 3 and second region 4, and is sandwiched between the second region 4 and an opening 1c, that is, inside from the second region 4. The fourth region 11j is connected to the second region 4 via the inclined portion 41j. The inclined portion 41j is inclined to connect the fourth region 11j and second region 4.

Figure 3I:
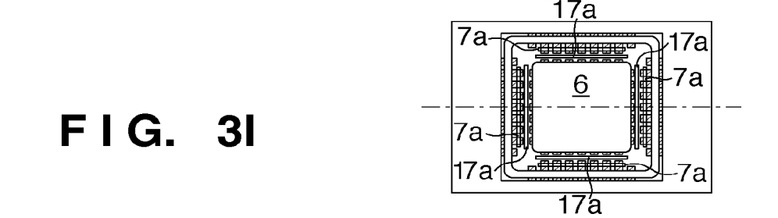

In the step of FIGS. 3C and 3I, a resin pattern RPj is molded with a resin. The resin pattern RPj further includes third resin portions 17i. The third resin portions 17i cover the top surfaces of peripheral portions, adjacent to second portions 4a to be removed, in the leads LPj while exposing the top surfaces of the second portions 4a to be removed in the leads LPj by cutting in the step of FIGS. 3D and 3J (to be described later) so that the third resin portions 17i hold a plurality of leads LPj from above them. More specifically, the third resin portions 17i include a plurality of second trenches 17a and a plurality of second main bodies 17b. The second trenches 17a extend between trenches 7a and a first resin portion 6 to cross the leads LPj adjacent in line. Each trench 17a exposes the top surface of the second portion 4a to be removed by cutting in the step of FIGS. 3D and 3J (to be described later) in the second region 4 of each lead LPj. The second main bodies 17b cover the top surfaces of the peripheral portions 4b adjacent to the second portion 4a to be removed in the second region 4 of each lead LPj. The second main bodies 17b extend on the two sides of the second trench 17a when viewed from the top. The second main bodies 17b extend to be connected to the first resin portion 6 at least at the corner. In other words, the third resin portions 17i, second resin portions 7i, and first resin portion 6 are integrally molded. The third resin portions 17i, second resin portions 7i, and first resin portion 6 can hold a plurality of leads LPj in cooperation with each other.

Figure 3J:
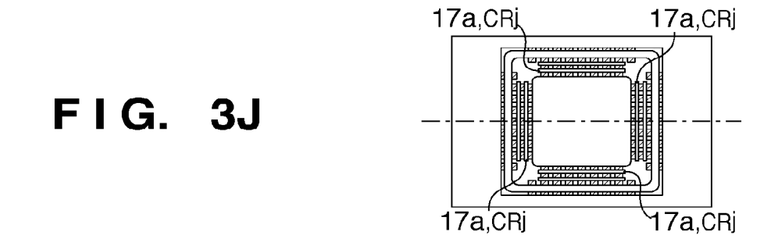

In the step of FIGS. 3D and 3J, the second portion 4a to be removed in each lead LPj is removed while the resin pattern RPj keeps holding the peripheral portions 4b adjacent to the second portion 4a to be removed in the lead LPj. As a result, the leads LPj are cut into a plurality of first leads 8 and a plurality of third leads 10j. More specifically, the second portion 4a to be removed in the second region 4 is punched from the bottom, removing the second portion 4a from the lead LPj. Accordingly, a slit including a removed region CRj and the second trench 17a is formed, and each lead LPj is cut into the first lead 8 and third lead 10j. The third lead 10j has a third portion 10a to be bonded and a third land 10b. A bonding wire is to be bonded to the third portion 10a. The third land 10b serves as a land electrode in the package.

Figure 3K:
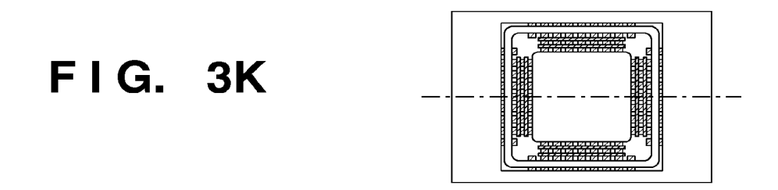

In the step of FIGS. 3E and 3K, the slits each including the removed region CRj and second trench 17a are filled with a resin, forming second filling portions 17c. Consequently, formation of third resin portions 17j including the second filling portions 17c and second main bodies 17b is completed. More specifically, the second filling portions 17c are formed to insulate the first lands 8b and the third lands 10b. The second main bodies 17b keep covering the first lands 8b and third lands 10b from above them.

Figure 3L:
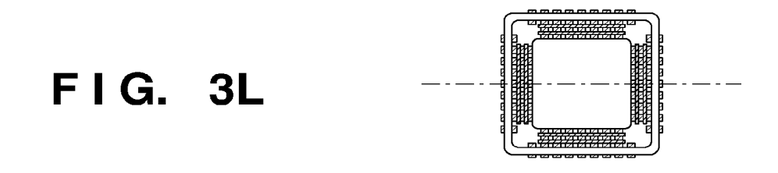

In the step of FIGS. 3F and 3L, regions IP (see FIG. 3E) between a plurality of second leads 9 and a frame FP are cut, thereby removing the frame FP and completing formation of the package PKj. At this time, the resin pattern RPj hold the first leads 8 and third leads 10j. More specifically, the second resin portions 7 and third resin portions 17j hold the first leads 8. The first resin portion 6 and third resin portions 17j hold the third leads 10j. The third resin portions 17j hold the gaps between the first leads 8 and the third leads 10j. The third resin portions 17j, second resin portions 7, and first resin portion 6 are integrally molded and hold the first leads 8, second leads 9, and third leads 10j in cooperation with each other. This structure suppresses misalignment of the leads LPj when removing the frame FP.

In the package PKj according to the second embodiment, a plurality of first lands, a plurality of second lands, and a plurality of third lands are arranged two-dimensionally on the bottom surface (lower surface) of the package. That is, land electrodes are arranged in a rectangular shape on three lines. This arrangement can easily increase the packaging density.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor device comprising:
   a semiconductor chip; and
   a package, said package including:
   a first resin portion, on a top surface of which said semiconductor chip is mounted;
   a plurality of first leads which are arranged in a first region outside said first resin portion and in a direction along an edge of said semiconductor chip, and have first lands and first portions to be bonded that are arranged outside said first lands;
   a plurality of second leads which are arranged in a second region that is outside said region where said plurality of first leads are arranged and that is farther outside said first resin portion than is said first region, and have second portions, and second lands arranged outside said second portions to be bonded; and
   second resin portions which insulate said plurality of first portions to be bonded and said plurality of second portions, and cover said plurality of first portions and said plurality of second portions from below said plurality of first portions to be bonded and said plurality of second portions.

2. The device according to claim 1, wherein said first resin portion and said second resin portions are integrally molded.

3. The device according to claim 1, wherein said semiconductor chip includes an image sensor.

4. The device according to claim 1, wherein
   said first portions are at a level higher than said first lands, and
   said second lands are at a level lower than said second portions.

5. The device according to claim 1, wherein said second resin portions are arranged between said first lands and said second lands.

6. The device according to claim 1, further comprising a third resin portion between said first portions and said second portions.

7. The device according to claim 3, further comprising a transparent cover above said semiconductor chip.

8. The device according to claim 7, wherein said transparent cover forms a space between said semiconductor chip and said transparent cover.

9. The device according to claim 8, wherein said space is sealed.

10. A semiconductor device comprising:
    a semiconductor chip; and
    a package,
    said package including:
    a first resin portion, on a top surface of which said semiconductor chip is mounted;
    a plurality of first leads which are arranged outside said first resin portion, and have first lands and first portions to be bonded that are arranged outside said first lands and at level higher than said first lands;
    a plurality of second leads which are arranged outside said plurality of first leads, and have second portions to be bonded, and second lands arranged outside said second portions and at level lower than said second portions;
    second resin portions which are arranged between said first lands and said second lands, and cover said plurality of first portions and said plurality of second portions from below said plurality of first portions and said plurality of second portions, with forming a trench exposing a space between said plurality of first portions and said plurality of second portions; and
    a third resin portion which is arranged between said plurality of first portions and said plurality of second portions, with filling the trench of said second resin portions so as to insulate said plurality of first portions and said plurality of second portions.

11. The device according to claim 10, wherein said first resin portion and said second resin portions are integrally molded.

12. The device according to claim 10, further comprising a transparent cover so as to form a space between said semiconductor chip and said transparent cover.

13. The device according to claim 10, wherein said semiconductor chip includes an image sensor.

* * * * *